(12) United States Patent
Ren et al.

(10) Patent No.: US 12,347,361 B2
(45) Date of Patent: Jul. 1, 2025

(54) SHIFT REGISTER UNITS, GATE DRIVER CIRCUITS, AND DISPLAY DEVICES

(71) Applicants: Beijing BOE Display Technology Co., Ltd., Beijing (CN); BOE Technology Group Co., Ltd., Beijing (CN)

(72) Inventors: Jinyu Ren, Beijing (CN); Haisheng Liu, Beijing (CN); Kuanjun Peng, Beijing (CN); Fangzhen Zhang, Beijing (CN); Jinqian Wang, Beijing (CN); Guojing Ma, Beijing (CN); Dan Wang, Beijing (CN); Wei Wang, Beijing (CN); Sha Feng, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/290,792

(22) PCT Filed: Nov. 22, 2021

(86) PCT No.: PCT/CN2021/132026
§ 371 (c)(1),
(2) Date: Jan. 21, 2024

(87) PCT Pub. No.: WO2023/087298
PCT Pub. Date: May 25, 2023

(65) Prior Publication Data
US 2024/0249660 A1      Jul. 25, 2024

(51) Int. Cl.
*G09G 3/20* (2006.01)
*G11C 19/28* (2006.01)

(52) U.S. Cl.
CPC ..... *G09G 3/2092* (2013.01); *G09G 2300/0842* (2013.01); *G09G 2310/0286* (2013.01); *G11C 19/28* (2013.01)

(58) Field of Classification Search
None
See application file for complete search history.

(56) References Cited

U.S. PATENT DOCUMENTS 9,324,288 B1 *   4/2016  Dai ................. G09G 3/3677
2013/0027377 A1   1/2013  Yang et al.
(Continued)

FOREIGN PATENT DOCUMENTS

CN    108172163 A    6/2018
CN    108648714 A    10/2018
(Continued)

OTHER PUBLICATIONS

PCT/CN2021/132026 international search report dated Aug. 1, 2022.
PCT/CN2021/132026 Written Opinion dated Aug. 1, 2022.

*Primary Examiner* — Matthew Yeung
(74) *Attorney, Agent, or Firm* — IPro, PLLC (57) ABSTRACT

The present disclosure provides a shift register unit, a gate driver circuit, and a display device, belonging to the field of display technology, which can solve the problem of unstable threshold voltage and current leakage of thin film transistors in existing shift register units. The shift register unit in the present disclosure includes: an input subcircuit, an output subcircuit, a pull-down control subcircuit, a pull-down subcircuit, a first noise reduction subcircuit, a first auxiliary control subcircuit, and a second auxiliary control subcircuit. The first auxiliary control subcircuit is configured to write the third reference level signal to the pull-down control node when the pull-down node is the first reference level signal, and control the pull-down subcircuit to be closed to control the first noise reduction subcircuit to be open.

20 Claims, 3 Drawing Sheets

(56) References Cited

U.S. PATENT DOCUMENTS

| | | | |
|---|---|---|---|
| 2015/0213746 A1 | 7/2015 | Kim et al. | |
| 2015/0325190 A1* | 11/2015 | Cao | G11C 19/28 377/64 |
| 2018/0211606 A1* | 7/2018 | Zhang | G09G 3/36 |
| 2019/0114951 A1* | 4/2019 | Li | G09G 3/20 |
| 2019/0114952 A1* | 4/2019 | Li | G11C 19/184 |
| 2019/0272884 A1 | 9/2019 | Liao et al. | |
| 2021/0074234 A1* | 3/2021 | Wang | G09G 3/3266 |
| 2021/0333973 A1 | 10/2021 | Su | |
| 2022/0327973 A1 | 10/2022 | Yang et al. | |

FOREIGN PATENT DOCUMENTS

| | | |
|---|---|---|
| CN | 109427277 A | 3/2019 |
| CN | 111243489 A | 6/2020 |
| CN | 113327537 A | 8/2021 |
| KR | 20130013766 A | 2/2013 |

* cited by examiner

SHIFT REGISTER UNITS, GATE DRIVER CIRCUITS, AND DISPLAY DEVICES

CROSS-REFERENCE TO RELATED APPLICATIONS

This application is a national stage of international PCT Application No. PCT/CN2021/132026 filed on Nov. 22, 2021, the entire contents of which are incorporated herein by reference.

TECHNICAL FIELD

The present disclosure relates to the field of display technology, and in particular to shift register units, gate driver circuits, and display devices.

BACKGROUND

GOA (Gate Driver on Array) technology can integrate a gate driver circuit onto an array substrate of a display panel, which not only saves costs but also achieves a neat design that is symmetrical on both sides of the panel compared to traditional COF (Chip on Film) or COG (Chip On Glass) processes. Further, a bonding region and a peripheral wiring space of the gate driver circuit can be omitted, which achieves a design of a narrow border for the display device and improves the production capacity and yield of the display device.

A material of an active layer of a thin film transistor in GOA can include a-Si (amorphous silicon), LTPS (low-temperature polycrystalline silicon), metal oxide semiconductors, such as a typical material IGZO (Indium Gallium Zinc Oxide), etc. A large-scale display typically uses metal oxide transistors (such as thin film transistors with an active-layer material of IGZO) as thin film transistors in GOA. However, as a size and a resolution of the display further increase, a thin film transistor including an oxide material with higher-mobility is required for GOA. When a thin film transistor with higher mobility is used, a threshold voltage of the thin film transistor is unstable, prone to negative bias fluctuations, causing leakage current in the thin film transistor, which affects the working performance of the GOA and makes the driven display panel prone to display defects.

SUMMARY

The present disclosure aims to solve at least one of the technical problems existing in the prior art, and provide a shift register unit, a gate driver circuit, and a display device.

In the first aspect, the embodiments of the present disclosure provide a shift register unit, including an input subcircuit, an output subcircuit, a pull-down control subcircuit, a pull-down subcircuit, a first noise reduction subcircuit, a first auxiliary control subcircuit, and a second auxiliary control subcircuit; where
  the input subcircuit is configured to, in response to an input signal from a signal input terminal, raise a potential of a pull-up node through the input signal, where the pull-up node is simultaneously connected to at least the input subcircuit, the output subcircuit, and the first noise reduction subcircuit;
  the output subcircuit is configured to, in response to a pulled-up potential of the pull-up node, output a signal through a signal output terminal;
  the pull-down control subcircuit is configured to, in response to a first power supply voltage signal, control a potential of a pull-down node through the first power supply voltage signal, where the pull-down node is simultaneously connected to at least the pull-down control subcircuit, the pull-down subcircuit, and the first noise reduction subcircuit;
  the pull-down subcircuit is configured to, in response to a potential of a pull-down control node, pull down the potential of the pull-down node through a first reference level signal, where the pull-down control node is simultaneously connected to at least the pull-down subcircuit, the first auxiliary control subcircuit, and the second auxiliary control subcircuit;
  the first noise reduction subcircuit is configured to, in response to the potential of the pull-down node, denoise a potential of the pull-up node through a second reference level signal;
  the first auxiliary control subcircuit is configured to, when the pull-down node is the first reference level signal, write a third reference level signal to the pull-down control node, and control the pull-down subcircuit to be closed to control the first noise reduction subcircuit to be open; and
  the second auxiliary control subcircuit is configured to, when the pull-down node is the first power voltage signal, write the first reference level signal to the pull-down control node, and control the pull-down subcircuit to be open to control the first noise reduction subcircuit to denoise the pull-up node through the second reference level signal.

In some embodiments, the first auxiliary control subcircuit includes a first storage capacitor, where one end of the first storage capacitor is connected to the pull-down control node, and the other end of the first storage capacitor is connected to the first power supply voltage terminal, where the pull-down control node is connected to the input subcircuit; and
  the second auxiliary control subcircuit includes a ninth transistor and a tenth transistor, where a control electrode of the ninth transistor is connected to an auxiliary control terminal, a first electrode of the ninth transistor is connected to a first reference level terminal, and a second electrode of the ninth transistor is connected to the pull-down control node, and a control electrode of the tenth transistor is connected to the pull-down node, a first electrode of the tenth transistor is connected to the first reference level terminal, and a second electrode of the tenth transistor is connected to the pull-down control node.

In some embodiments, the first auxiliary control subcircuit includes an eleventh transistor, where a control electrode and a first electrode of the eleventh transistor are connected to the signal input terminal, and a second electrode of the eleventh transistor is connected to the pull-down control node; and
  the second auxiliary control subcircuit includes a twelfth transistor and a thirteenth transistor, where a control electrode of the twelfth transistor is connected to an auxiliary control terminal, a first electrode of the twelfth transistor is connected to a first reference level terminal, and the second electrode of the twelfth transistor is connected to the pull-down control node, and a control electrode of the thirteenth transistor is connected to the pull-down node, a first electrode of the thirteenth transistor is connected to the first reference level terminal, and a second electrode of the thirteenth transistor is connected to the pull-down control node.

In some embodiments, the first auxiliary control subcircuit includes a fourteenth transistor, where a control electrode and a first electrode of the fourteenth transistor are connected to a first power supply voltage terminal, and a second electrode of the fourteenth transistor is connected to the pull-down control node; and the second auxiliary control subcircuit includes a fifteenth transistor and a sixteenth transistor, where a control electrode of the fifteenth transistor is connected to the pull-down node, a first electrode of the fifteenth transistor is connected to a first reference level terminal, and a second electrode of the fifteenth transistor is connected to the pull-down control node, and a control electrode of the sixteenth transistor is connected to an auxiliary control terminal, a first electrode of the sixteenth transistor is connected to the first reference level terminal, and a second electrode of the sixteenth transistor is connected to the pull-down control node.

In some embodiments, the shift register unit further includes a second noise reduction subcircuit, where the second noise reduction subcircuit is configured to, in response to the potential of the pull-down node, denoise a potential of the signal output terminal through the second reference level signal.

In some embodiments, the second noise reduction subcircuit includes a fourth transistor, where a control electrode of the fourth transistor is connected to the pull-down node, a first electrode of the fourth transistor is connected to the second reference level terminal, and a second electrode of the fourth transistor is connected to the signal output terminal.

In some embodiments, the shift register unit further includes a reset subcircuit, where the reset subcircuit is configured to, in response to a reset signal, reset a potential of the pull-up node through the second reference level signal.

In some embodiments, the reset subcircuit includes a second transistor, where a control electrode of the second transistor is connected to a reset signal terminal, a first electrode of the second transistor is connected to the second reference level terminal, and a second electrode of the second transistor is connected to the pull-up node.

In some embodiments, the input subcircuit includes a first transistor, where a control electrode and a first electrode of the first transistor are connected to the signal input terminal, and the second electrode of the first transistor is connected to the pull-up node.

In some embodiments, the output subcircuit includes a third transistor and a second storage capacitor, where a control electrode of the third transistor is connected to the pull-up node, a first electrode of the third transistor is connected to a clock signal terminal, and a second electrode of the third transistor is connected to the signal output terminal; and one end of the second storage capacitor is connected to the pull-up node, and the other end of the second storage capacitor is connected to the signal output terminal.

In some embodiments, the pull-down control subcircuit includes a fifth transistor, where a control electrode and a first electrode of the fifth transistor are connected to the first power supply voltage terminal, and a second electrode of the fifth transistor is connected to the pull-down node.

In some embodiments, the pull-down subcircuit includes a sixth transistor and a seventh transistor, where a control electrode of the sixth transistor is connected to the pull-down control node, a first electrode of the sixth transistor is connected to the first reference level terminal, and a second electrode of the sixth transistor is connected to the pull-down node;

a control electrode of the seventh transistor is connected to the signal input terminal, a first electrode of the seventh transistor is connected to the first power supply voltage terminal, and a second electrode of the seventh transistor is connected to the pull-down node.

In some embodiments, the first noise reduction subcircuit includes an eighth transistor, where a control electrode of the eighth transistor is connected to the pull-down node, a first electrode of the eighth transistor is connected to the first reference level terminal, and a second electrode of the eighth transistor is connected to the pull-up node.

In the second aspect, the embodiments of the present disclosure provides a shift register unit, including an input subcircuit, a reset subcircuit, an output subcircuit, a pull-down control subcircuit, a pull-down subcircuit, a first noise reduction subcircuit, a second noise reduction subcircuit, a first auxiliary control subcircuit, and a second auxiliary control subcircuit, where a pull-up node is simultaneously connected to at least the input subcircuit, the output subcircuit, and the first noise reduction subcircuit, a pull-down node is simultaneously connected to at least the pull-down control subcircuit, the pull-down subcircuit, and the first noise reduction subcircuit, and a pull-down control node is simultaneously connected to at least the pull-down subcircuit, the first auxiliary control subcircuit, and the second auxiliary control subcircuit; where the input subcircuit includes a first transistor, the reset subcircuit includes a second transistor, the output subcircuit includes a third transistor and a second storage capacitor, the second noise reduction subcircuit includes a fourth transistor, the pull-down control subcircuit includes a fifth transistor, the pull-down subcircuit includes a sixth transistor and a seventh transistor, the first noise reduction subcircuit includes an eighth transistor, the first auxiliary control subcircuit includes a first storage capacitor, and the second auxiliary control subcircuit includes a ninth transistor and a tenth transistor; where a control electrode and a first electrode of the first transistor are connected to the signal input terminal, and a second electrode of the first transistor is connected to the pull-up node, and the pull-up node is simultaneously connected to at least the input subcircuit, the output subcircuit, and the first noise reduction subcircuit;

a control electrode of the second transistor is connected to a reset signal terminal, a first electrode of the second transistor is connected to the second reference level terminal, and a second electrode of the second transistor is connected to the pull-up node;

a control electrode of the third transistor is connected to the pull-up node, a first electrode of the third transistor is connected to a clock signal terminal, and a second electrode of the third transistor is connected to the signal output terminal; and one end of the second storage capacitor is connected to the pull-up node, and the other end of the second storage capacitor is connected to the signal output terminal;

a control electrode of the fourth transistor is connected to the pull-down node, a first electrode of the fourth transistor is connected to the second reference level terminal, and a second electrode of the fourth transistor is connected to the signal output terminal;

a control electrode and a first electrode of the fifth transistor are connected to the first power supply voltage terminal, and a second electrode of the fifth transistor is connected to the pull-down node;

a control electrode of the sixth transistor is connected to the pull-down control node, a first electrode of the sixth transistor is connected to the first reference level terminal, and a second electrode of the sixth transistor is connected to the pull-down node;

a control electrode of the seventh transistor is connected to the signal input terminal, a first electrode of the seventh transistor is connected to the first power supply voltage terminal, and a second electrode of the seventh transistor is connected to the pull-down node;

a control electrode of the eighth transistor is connected to the pull-down node, a first electrode of the eighth transistor is connected to the first reference level terminal, and a second electrode of the eighth transistor is connected to the pull-up node;

one end of the first storage capacitor is connected to the pull-down control node, and the other end of the first storage capacitor is connected to the first power supply voltage terminal, and the pull-down control node is connected to the second electrode of the first transistor; and a control electrode of the ninth transistor is connected to an auxiliary control terminal, a first electrode of the ninth transistor is connected to a first reference level terminal, and a second electrode of the ninth transistor is connected to the pull-down control node, and a control electrode of the tenth transistor is connected to the pull-down node, a first electrode of the tenth transistor is connected to the first reference level terminal, and a second electrode of the tenth transistor is connected to the pull-down control node.

In the third aspect, the embodiments of the present disclosure provides a shift register unit, including an input subcircuit, a reset subcircuit, an output subcircuit, a pull-down control subcircuit, a pull-down subcircuit, a first noise reduction subcircuit, a second noise reduction subcircuit, a first auxiliary control subcircuit, and a second auxiliary control subcircuit, where a pull-up node is simultaneously connected to at least the input subcircuit, the output subcircuit, and the first noise reduction subcircuit, a pull-down node is simultaneously connected to at least the pull-down control subcircuit, the pull-down subcircuit, and the first noise reduction subcircuit, and a pull-down control node is simultaneously connected to at least the pull-down subcircuit, the first auxiliary control subcircuit, and the second auxiliary control subcircuit; where the input subcircuit includes a first transistor, the reset subcircuit includes a second transistor, the output subcircuit includes a third transistor and a second storage capacitor, the second noise reduction subcircuit includes a fourth transistor, the pull-down control subcircuit includes a fifth transistor, the pull-down subcircuit includes a sixth transistor and a seventh transistor, the first noise reduction subcircuit includes an eighth transistor, the first auxiliary control subcircuit includes an eleventh transistor, and the second auxiliary control subcircuit includes a twelfth transistor and a thirteenth transistor; where a control electrode and a first electrode of the first transistor are connected to the signal input terminal, and a second electrode of the first transistor is connected to the pull-up node, and the pull-up node is simultaneously connected to at least the input subcircuit, the output subcircuit, and the first noise reduction subcircuit;

a control electrode of the second transistor is connected to a reset signal terminal, a first electrode of the second transistor is connected to the second reference level terminal, and a second electrode of the second transistor is connected to the pull-up node;

a control electrode of the third transistor is connected to the pull-up node, a first electrode of the third transistor is connected to a clock signal terminal, and a second electrode of the third transistor is connected to the signal output terminal; and one end of the second storage capacitor is connected to the pull-up node, and the other end of the second storage capacitor is connected to the signal output terminal;

a control electrode of the fourth transistor is connected to the pull-down node, a first electrode of the fourth transistor is connected to the second reference level terminal, and a second electrode of the fourth transistor is connected to the signal output terminal;

a control electrode and a first electrode of the fifth transistor are connected to the first power supply voltage terminal, and a second electrode of the fifth transistor is connected to the pull-down node;

a control electrode of the sixth transistor is connected to the pull-down control node, a first electrode of the sixth transistor is connected to the first reference level terminal, and a second electrode of the sixth transistor is connected to the pull-down node;

a control electrode of the seventh transistor is connected to the signal input terminal, a first electrode of the seventh transistor is connected to the first power supply voltage terminal, and a second electrode of the seventh transistor is connected to the pull-down node;

a control electrode of the eighth transistor is connected to the pull-down node, a first electrode of the eighth transistor is connected to the first reference level terminal, and a second electrode of the eighth transistor is connected to the pull-up node;

a control electrode and a first electrode of the eleventh transistor are connected to the signal input terminal, and a second electrode of the eleventh transistor is connected to the pull-down control node; and a control electrode of the twelfth transistor is connected to an auxiliary control terminal, a first electrode of the twelfth transistor is connected to a first reference level terminal, and a second electrode of the twelfth transistor is connected to the pull-down control node, and a control electrode of the thirteenth transistor is connected to the pull-down node, a first electrode of the thirteenth transistor is connected to the first reference level terminal, and a second electrode of the thirteenth transistor is connected to the pull-down control node.

In the fourth aspect, the embodiments of the present disclosure provides a shift register unit, including an input subcircuit, a reset subcircuit, an output subcircuit, a pull-down control subcircuit, a pull-down subcircuit, a first noise reduction subcircuit, a second noise reduction subcircuit, a first auxiliary control subcircuit, and a second auxiliary control subcircuit, where a pull-up node is simultaneously connected to at least the input subcircuit, the output subcircuit, and the first noise reduction subcircuit, a pull-down node is simultaneously connected to at least the pull-down control subcircuit, the pull-down subcircuit, and the first noise reduction subcircuit, and a pull-down control node is simultaneously connected to at least the pull-down subcircuit, the first auxiliary control subcircuit, and the second auxiliary control subcircuit; where the input subcircuit includes a first transistor, the reset subcircuit includes a second transistor, the output subcircuit includes a third transistor and a second storage capacitor, the second noise reduction subcircuit includes a fourth transistor, the pull-down control subcircuit includes a fifth transistor, the pull-down subcircuit includes a sixth transistor and a seventh transistor, the first noise reduction subcircuit includes an eighth transistor, the first auxiliary control subcircuit includes a fourteenth transistor, and the second auxiliary control subcircuit includes a fifteenth transistor and a sixteenth transistor; where a control electrode and a first electrode of the first transistor are connected to the signal input terminal, and a second electrode of the first transistor is connected to the pull-up node, and the pull-up node is simultaneously connected to at least the input subcircuit, the output subcircuit, and the first noise reduction subcircuit;

a control electrode of the second transistor is connected to a reset signal terminal, a first electrode of the second transistor is connected to the second reference level terminal, and a second electrode of the second transistor is connected to the pull-up node;

a control electrode of the third transistor is connected to the pull-up node, a first electrode of the third transistor is connected to a clock signal terminal, and a second electrode of the third transistor is connected to the signal output terminal; and one end of the second storage capacitor is connected to the pull-up node, and the other end of the second storage capacitor is connected to the signal output terminal;

a control electrode of the fourth transistor is connected to the pull-down node, a first electrode of the fourth transistor is connected to the second reference level terminal, and a second electrode of the fourth transistor is connected to the signal output terminal;

a control electrode and a first electrode of the fifth transistor are connected to the first power supply voltage terminal, and a second electrode of the fifth transistor is connected to the pull-down node;

a control electrode of the sixth transistor is connected to the pull-down control node, a first electrode of the sixth transistor is connected to the first reference level terminal, and a second electrode of the sixth transistor is connected to the pull-down node;

a control electrode of the seventh transistor is connected to the signal input terminal, a first electrode of the seventh transistor is connected to the first power supply voltage terminal, and a second electrode of the seventh transistor is connected to the pull-down node;

a control electrode of the eighth transistor is connected to the pull-down node, a first electrode of the eighth transistor is connected to the first reference level terminal, and a second electrode of the eighth transistor is connected to the pull-up node;

a control electrode and a first electrode of the fourteenth transistor are connected to a first power supply voltage terminal, and a second electrode of the fourteenth transistor is connected to the pull-down control node; and a control electrode of the fifteenth transistor is connected to the pull-down node, a first electrode of the fifteenth transistor is connected to a first reference level terminal, and a second electrode of the fifteenth transistor is connected to the pull-down control node, and a control electrode of the sixteenth transistor is connected to an auxiliary control terminal, a first electrode of the sixteenth transistor is connected to the first reference level terminal, and a second electrode of the sixteenth transistor is connected to the pull-down control node.

In a fifth aspect, the embodiments of the present disclosure provide a gate driver circuit, including a plurality of the shift register units described above that are mutually cascaded.

In some embodiments, a signal input terminal of a current shift register unit is connected to a signal output terminal of a previous shift register unit immediately adjacent to the current shift register unit;

a reset signal terminal of the current shift register unit is connected to a signal output terminal of a next shift register unit immediately adjacent to the current shift register unit; and an auxiliary control terminal of the current shift register unit is connected to the signal output terminal of the next shift register unit immediately adjacent to the current shift register unit.

In a sixth aspect, the embodiments of the present disclosure provide a display device, including the gate driver circuit described above.

In the seventh aspect, the present disclosed embodiment provides a driving method for a shift register unit, for driving the shift register unit described above, where the driving method for the shift register unit includes:

when the pull-down node is the first reference level signal, by the first auxiliary control subcircuit, writing the third reference level signal to the pull-down control node, and controlling the pull-down subcircuit to be closed to control the first noise reduction subcircuit to be open; and when the pull-down node is the first power voltage signal, by a second auxiliary control subcircuit, writing the first reference level signal to the pull-down control node, and controlling the pull-down subcircuit to be open to control the first noise reduction subcircuit to denoise the pull-up node through the second reference level signal.

DETAILED DESCRIPTION

In order to enable those skilled in the art to better understand the technical solutions in the present disclosure, the following will provide a further detailed description of the present disclosure in conjunction with the accompanying drawings and embodiments.

Unless otherwise defined, the technical terms or scientific terms used in the present disclosure shall have the ordinary meanings understood by those skilled in the art to which the present disclosure belongs. "First", "second" and similar words used in the present disclosure do not indicate any sequence, quantity or importance, but are only used to distinguish different components. Likewise, words like "a" or "one" do not indicate a limitation of quantity, but mean that there is at least one. "include", "comprise" and similar terms mean that the elements or items listed before "include" or "comprise" include the elements or items listed after "include" or "comprise" and their equivalents, and do not exclude other elements or objects. Words such as "connect" or "couple" are not limited to physical or mechanical connections, and may include electrical connections, whether direct or indirect. Terms "up", "down", "left", "right", etc. are only used to represent relative positional relationships. When an absolute position of a described object changes, the relative positional relationship may also change accordingly.

A transistor used in the embodiments of the present disclosure can be a thin film transistor, a field-effect transistor, or other devices with the same characteristics. Since the source electrode and the drain electrode of the transistor used are symmetrical, there is no functional difference between the source electrode and the drain electrode. In the embodiments of the present disclosure, to distinguish a source electrode and a drain electrode of a transistor, one of the source electrode and the drain electrode is referred to as a first electrode, the other is referred to as a second electrode, and a gate electrode is referred to as a control electrode. In addition, according to a characteristic of a transistor, a transistor can be divided into N-type or P-type. In the following embodiments, an N-type transistor is used for explanation. When an N-type transistor is used, the first electrode is a drain electrode of the N-type transistor, and the second electrode is a source electrode of the N-type transistor, and when a gate input is high-level, and the source electrode and the drain electrode are conductive, which is opposite to the P-type. Using the P-type transistor to implement the present disclosure is that those skilled in the art can easily think of without putting in creative efforts, and therefore falls within the protection scope of the present disclosure.

It should be noted that in the embodiments, a third reference level signal refers to a high-level signal, while a first reference level signal and a second reference level signal both refer to a low-level signal. Correspondingly, a first power supply voltage terminal refers to a signal terminal VDD, a first reference level terminal refers to a first low-level terminal LVGL, and a first reference level signal refers to a first low-level signal, a second reference level terminal refers to a second low-level terminal VGL, and a second reference level signal refers to a second low-level signal, where a voltage of the first low-level signal is lower than a voltage of the second low-level signal.

Figure 1:
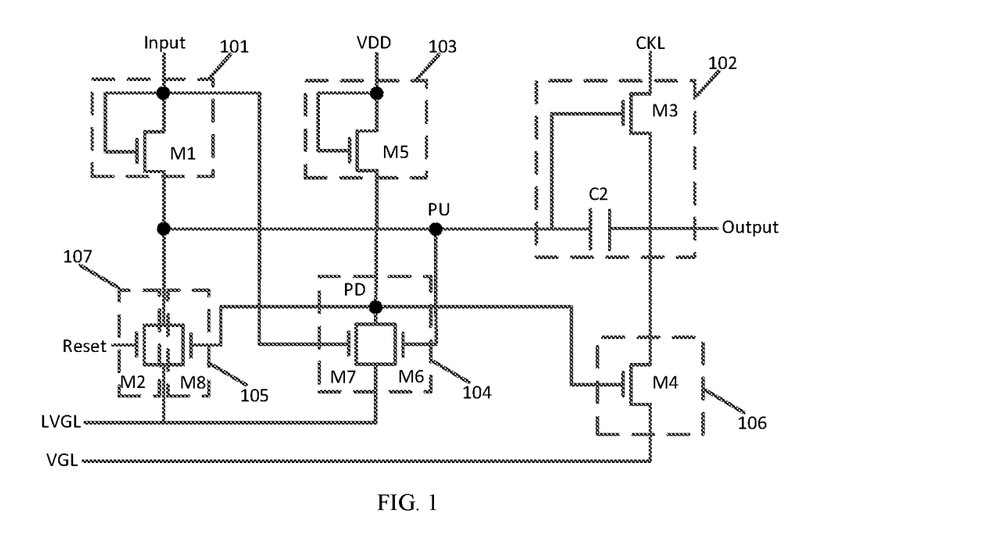
FIG. 1 is a schematic diagram of a circuit structure of a shift register for instance.

FIG. 1 is a schematic diagram of a circuit structure of a shift register for instance. As shown in FIG. 1, the shift register unit includes an input subcircuit 101, an output subcircuit 102, a pull-down control subcircuit 103, a pull-down subcircuit 104, a first noise reduction subcircuit 105, a second noise reduction subcircuit 106, and a reset subcircuit 107. The input subcircuit 101 includes a first transistor M1, the output subcircuit 102 includes a third transistor M3 and a second storage capacitor C2, the pull-down control subcircuit 103 includes a transistor M5, the pull-down subcircuit 104 includes a sixth transistor M6 and a seventh transistor M7, the first noise reduction circuit 105 includes an eighth transistor M8, the second noise reduction subcircuit 106 includes a fourth transistor M4, and the reset subcircuit 107 includes a second transistor M2.

A gate electrode and a source electrode of the first transistor M1 are connected to a signal input terminal Input, and a drain electrode of the first transistor M1 is connected to a pull-up node PU. A gate electrode of the third transistor M3 is connected to the pull-up node PU, a source electrode of the third transistor M3 is connected to a clock signal terminal CLK, and a gate electrode of the third transistor M3 is connected to a signal output terminal Output. One end of the second storage capacitor C2 is connected to the pull-up node PU, and the other end of the second storage capacitor C2 is connected to the signal output terminal Output. A gate electrode and a source electrode of the fifth transistor M5 are connected to a first power supply voltage terminal VDD, and a drain electrode of the fifth transistor M5 is connected to a pull-down node PD. A gate electrode of the sixth transistor M6 is connected to the pull-up node PU, a source electrode of the sixth transistor M6 is connected to a first reference level terminal LVGL, and a drain electrode of the sixth transistor M6 is connected to the pull-down node PD. A gate electrode of the seventh transistor M7 is connected to the signal input terminal Input, a source electrode of the seventh transistor M7 is connected to the first low-level terminal LVGL, and a drain electrode of the seventh transistor M7 is connected to the pull-down node PD. A gate electrode of the eighth transistor M8 is connected to the pull-down node PD, a source electrode of the eighth transistor M8 is connected to the first low-level terminal LVGL, and a drain electrode of the eighth transistor M8 is connected to the pull-up node PU. A gate electrode of the fourth transistor M4 is connected to the pull-down node PD, a source electrode of the fourth transistor M4 is connected to a second reference level terminal VGL, and a drain electrode of the fourth transistor M4 is connected to the signal output terminal Output. A gate electrode of the second transistor M2 is connected to a reset signal terminal Reset, a source electrode of the second transistor M2 is connected to the first reference level terminal LVGL, and a drain electrode of the second transistor M2 is connected to the pull-up node PU.

A working process of the shift register unit shown in FIG. 1 can include the following stages of a precharge stage, an output stage, a reset stage, and a noise reduction stage.

In the precharge stage, by the signal input terminal Input, a high-level signal is input, and the first transistor M1 is turned on. At this point, the high-level signal input by the signal input terminal Input pulls up a potential of the pull-up node PU and stores it through the second storage capacitor C2.

In the output stage, by the signal input terminal Input, a low-level signal is input, and the first transistor M1 is turned off. At this point, since the second storage capacitor C2 is charged in the precharge stage, the potential of the pull-up node PU is further raised. Since the gate electrode of the third transistor M3 is connected to the pull-up node PU, the third transistor M3 is turned on, and by the output signal terminal Output, a clock signal of the clock signal terminal CLK is output as an output signal. At this point, the clock signal is a high-level signal, and the output signal is also a high-level signal.

In the reset stage, by the signal input terminal Input, a low-level signal is input, and the first transistor M1 is turned off. At this point, by the reset signal terminal Reset, a high-level signal is input, the second transistor M2 is turned on, a first low-level signal of the first low-level terminal LVGL is written into the pull-up node PU, and a potential of the pull-up node PU is reset.

In the noise reduction stage, by the signal input terminal Input, a low-level signal is input, and the first transistor M1 is turned off By the reset signal terminal Reset, a low-level signal is input, and the second transistor M2 is turned off. At this point, the potential of the pull-up node PU remains a potential at the reset stage, which is a second low-level potential. At this point, the third transistor M3, the fourth transistor M4, the sixth transistor M6, the seventh transistor M7, the eighth transistor M8, and the pull-down node PD remain a working state in the reset stage, and the pull-up node PU and the signal output terminal Output are continuously denoised.

In a large-sized and high-resolution display, when an oxide thin film transistor with higher mobility is used, the Vth (threshold voltage) of the thin film transistor is unstable, and the Vg (gate voltage) of the eighth transistor M8 is prone to negative bias fluctuations. The negative bias fluctuations of the eighth transistor M8 cause the pull-up node PU to leak electricity through the eighth transistor M8, which affects the working performance of the shift register unit circuit and makes the driven display panel prone to display defects.

In order to solve at least one of the technical problems mentioned above, the embodiments of the present disclosure provide a shift register unit, a gate driver circuit, and a display device. The following will provide a further detailed description of the shift register unit, the gate driver circuit, and the display device provided by the embodiments of the present disclosure.

Figure 2:
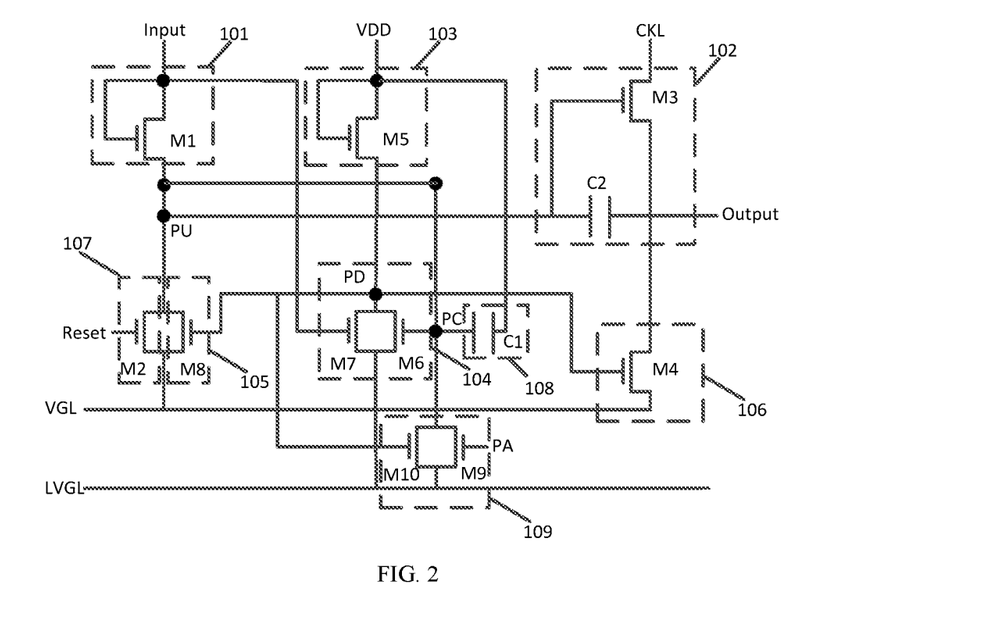
FIG. 2 is a schematic diagram of a circuit structure of a shift register unit according to embodiments of the present disclosure.

The embodiments of the present disclosure provide a shift register unit. FIG. 2 is a schematic diagram of a circuit structure of a shift register unit according to embodiments of the present disclosure. As shown in FIG. 2, the shift register unit provided by the embodiments of the present disclosure includes: an input subcircuit 101, an output subcircuit 102, a pull-down control subcircuit 103, a pull-down subcircuit 104, a first noise reduction subcircuit 105, a first auxiliary control subcircuit 108 and a second auxiliary control subcircuit 109. The input subcircuit 101 is configured to raise the potential of the pull-up node PU through the input signal in response to the input signal of the signal input terminal Input. The pull-up node PU is simultaneously connected to at least the input subcircuit 101, the output subcircuit 102, and the first noise reduction subcircuit 105. The output subcircuit 102 is configured to output a signal through the signal output terminal Output in response to the raised potential of the pull-up node PU. The pull-down control subcircuit 103 is configured to control the potential of the pull-down node PD through the first power supply voltage signal in response to the first power supply voltage signal. The pull-down node PD is simultaneously connected to at least the pull-down control subcircuit 103, the pull-down subcircuit 104, and the first noise reduction subcircuit 105. The pull-down subcircuit 104 is configured to pull down the potential of the pull-down node PD through the first low-level signal in response to the potential of the pull-down control node PC. The pull-down control node PC is simultaneously connected to at least the pull-down subcircuit 104, the first auxiliary control subcircuit 108, and the second auxiliary control subcircuit 109. The first noise reduction subcircuit 105 is configured to, in response to the potential of the pull-down node PD, denoise the potential of the pull-up node PU through the second low-level signal. The first auxiliary control subcircuit 108 is configured to write a high-level signal to the pull-down control node PC when the pull-down node PD is the first low-level signal, and control the pull-down subcircuit 104 to close to control the first noise reduction subcircuit 105 to open. The second auxiliary control subcircuit 109 is configured to write the first low-level signal to the pull-down control node PC when the pull-down node PD is the first power supply voltage signal, and control the pull-down subcircuit 104 to open to control the first noise reduction subcircuit 105 to denoise the pull-up node PU through the second low-level signal.

In the shift register unit provided by the embodiments of the present disclosure, since the first auxiliary control subcircuit 108 is added to the shift register unit, when the pull-up node PU is a high-level signal, the pull-down node PD is the first low-level signal, and the pull-down control node PC is a high-level signal. At this point, the pull-down subcircuit 104 continues to be closed, causing the potential of the pull-down node PD to be continuously pulled down by the first low-level signal, thereby ensuring that the first noise reduction subcircuit 105 is fully open, and the voltages of the first low-level signal and the second low-level signal can be used to control the first noise reduction subcircuit 105 to be fully open, which can avoid the influence of the first noise reduction subcircuit 105 on the potential of the pull-up node PU, i.e., avoid electricity leakage of the pull-up node PU. At the same time, the second auxiliary control subcircuit 109 is added to the shift register unit. When the pull-up node PU is a low-level signal, the pull-down node PD is the first power supply voltage signal, i.e., the pull-down node PD is a high-level signal, and the pull-down control node PC is the first low-level signal. At this point, the pull-down subcircuit 104 remains open, such that the first power supply voltage signal continues to be written into the pull-down node PD, which ensures that the first noise reduction subcircuit 105 is fully closed, thereby ensuring that the first noise reduction subcircuit 105 continuously denoises the pull-up node PU through the second low-level signal. It can be seen that in the shift register unit provided by the embodiments of the present disclosure, regardless of whether the first noise reduction subcircuit 105 is open or closed, the potential of the pull-up node PU can reach a preset potential, avoiding the influence of the first noise reduction subcircuit 105 on the potential of the pull-up node PU, thereby ensuring the stability of an output signal of the signal output terminal Output, and thus ensuring a good display effect of the driven display panel.

In some embodiments, as shown in FIG. 2, the first auxiliary control subcircuit 108 includes a first storage capacitor C1. One end of the first storage capacitor C1 is connected to the pull-down control node PC, and the other end is connected to the first power supply voltage terminal VDD. The pull-down control node PC is connected to the input subcircuit 101. The second auxiliary control subcircuit 109 includes a ninth transistor M9 and a tenth transistor M10, where the gate electrode of the ninth transistor M9 is connected to the auxiliary control terminal PA, the source electrode of the ninth transistor M9 is connected to the first low-level terminal LVGL, and the drain electrode of the ninth transistor M9 is connected to the pull-down control node PC, and the gate electrode of the tenth transistor M10 is connected to the pull-down node PD, the source electrode of the tenth transistor M10 is connected to the first low-level terminal LVGL, and the drain electrode of the tenth transistor M10 is connected to the pull-down control node PC.

When the first storage capacitor C1 and the pull-up node PU are simultaneously charged with a high-level signal, the high-level signal stored by the first storage capacitor C1 can pull up the potential of the pull-down control node PC to control the pull-down subcircuit 104 to remain closed, such that the potential of the pull-down node PD continue to be pulled down by the first low-level signal, ensuring that the first noise reduction subcircuit 105 is fully open, which can avoid the influence of the first noise reduction subcircuit 105 on the potential of the pull-up node PU, i.e., avoid electricity leakage of the pull-up node PU. When a high-level signal is written into the auxiliary control node PA, the ninth transistor M9 is turned on, the pull-up node PU is discharged to the second low-level potential, and the first storage capacitor C1 is discharged to the first low-level potential, such that the pull-down control node PC is the first low-level potential, the pull-down subcircuit 104 is open, and the first power supply voltage signal is written into the pull-down node PD, i.e., the pull-down node PD is high-level, and the tenth transistor M10 continues to be turned on, the pull-down subcircuit 104 continues to be open, the first power supply voltage signal continues to be written into the pull-down node PD, and the first noise reduction subcircuit 105 continues to be closed, which can continuously denoise the pull-up node PU. It can be seen that in the shift register unit provided by the embodiments of the present disclosure, regardless of whether the first noise reduction subcircuit 105 is open or closed, the potential of the pull-up node PU can reach a preset potential, avoiding the influence of the first noise reduction subcircuit 105 on the potential of the pull-up node PU, thereby ensuring the stability of an output signal of the signal output terminal Output, and thus ensuring a good display effect of the driven display panel.

Figure 3:
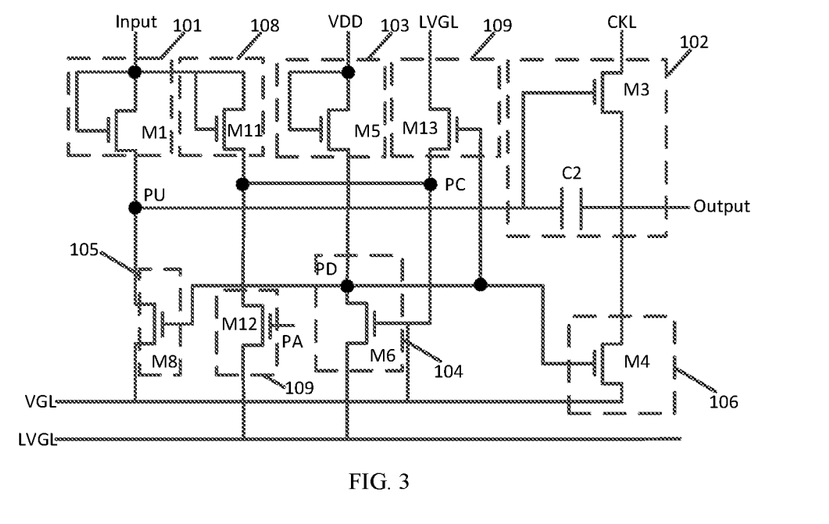
FIG. 3 is a schematic diagram of a circuit structure of a shift register unit according to embodiments of the present disclosure.

In some embodiments, FIG. 3 is a schematic diagram of a circuit structure of a shift register unit according to embodiments of the present disclosure. As shown in FIG. 3, the first auxiliary control subcircuit 108 includes an eleventh transistor M11, where the gate electrode and the source electrode of the eleventh transistor M11 are connected to the signal input terminal Input, and the drain electrode of the eleventh transistor M11 is connected to the pull-down control node PC. The second auxiliary control subcircuit 109 includes a twelfth transistor M12 and a thirteenth transistor M13, where the gate electrode of the twelfth transistor M12 is connected to the auxiliary control terminal PA, the source electrode of the twelfth transistor M12 is connected to the first low-level terminal LVGL, and the drain electrode of the twelfth transistor M12 is connected to the pull-down control node PC, and the gate electrode of the thirteenth transistor M13 is connected to the pull-down node PD, the source electrode of the thirteenth transistor M13 is connected to the first low-level terminal LVGL, and the drain electrode of the thirteenth transistor M13 is connected to the pull-down control node PC.

When both the pull-down control node PC and the pull-up node PU are simultaneously charged with high-level signals, the pull-down subcircuit 104 remains closed, such that the potential of the pull-down node PD continue to be pulled down by the first low-level signal, ensuring that the first noise reduction subcircuit 105 is fully open, which can avoid the influence of the first noise reduction subcircuit 105 on the potential of the pull-up node PU, i.e., avoid electricity leakage of the pull-up node PU. When a high-level signal is written into the auxiliary control node PA, the twelfth transistor M12 is turned on, the pull-down control node PC is pulled down to the first low level, the pull-down subcircuit 104 is open, the pull-down node PD is the first low level, the thirteenth transistor M13 is turned on, the first low-level signal is continuously written into the pull-down node PD, the pull-down subcircuit 104 is continuously open, the first power supply voltage signal is continuously written into the pull-down node PD, and the first noise reduction subcircuit 105 continues to be closed, which continuously denoises the pull-up node PU. It can be seen that in the shift register unit provided by the embodiments of the present disclosure, regardless of whether the first noise reduction subcircuit 105 is open or closed, the potential of the pull-up node PU can reach a preset potential, avoiding the influence of the first noise reduction subcircuit 105 on the potential of the pull-up node PU, thereby ensuring the stability of an output signal of the signal output terminal Output, and thus ensuring a good display effect of the driven display panel.

Figure 4:
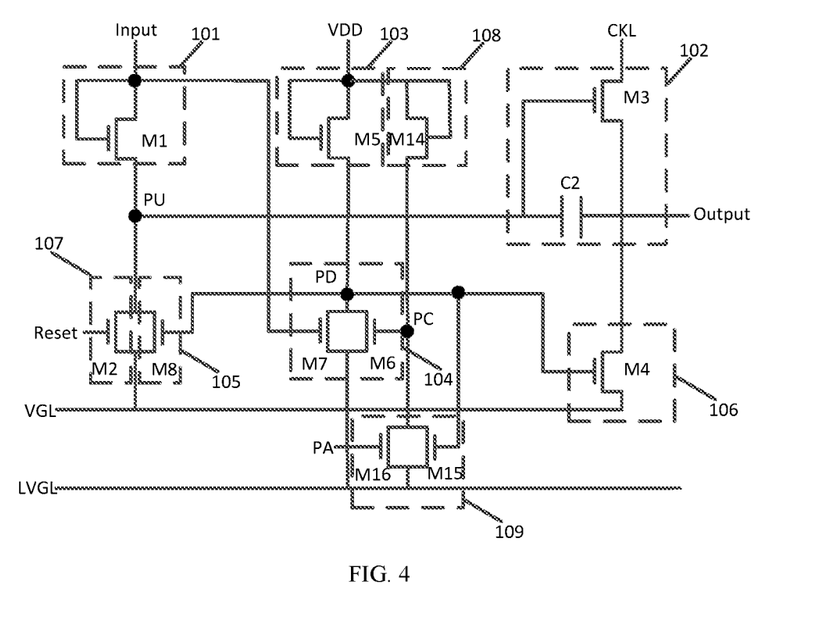
FIG. 4 is a schematic diagram of a circuit structure of a shift register unit according to embodiments of the present disclosure.

In some embodiments, FIG. 4 is a schematic diagram of a circuit structure of a shift register unit according to embodiments of the present disclosure. As shown in FIG. 4, the first auxiliary control subcircuit 108 includes a fourteenth transistor M14, where the gate electrode and the source electrode of the fourteenth transistor M14 are connected to the first power supply voltage terminal VDD, and the drain electrode of the fourteenth transistor M14 is connected to the pull-down control node PC. The second auxiliary control subcircuit 109 includes a fifteenth transistor M15 and a sixteenth transistor M16, where the gate electrode of the fifteenth transistor M15 is connected to the pull-down node PD, the source electrode of the fifteenth transistor M15 is connected to the first low-level terminal LVGL, and the drain electrode of the fifteenth transistor M15 is connected to the pull-down control node PC, and the gate electrode of the sixteenth transistor M16 is connected to the auxiliary control terminal PA, the source electrode of the sixteenth transistor M16 is connected to the first low-level terminal LVGL, and the drain electrode of the sixteenth transistor M16 is connected to the pull-down control node PC.

When the first power supply voltage signals are simultaneously written into the pull-down control node PC and the pull-down node PD, the pull-down subcircuit 104 remains closed, such that the potential of the pull-down node PD continue to be pulled down by the first low-level signal, ensuring that the first noise reduction subcircuit 105 is fully open, which can avoid the influence of the first noise reduction subcircuit 105 on the potential of the pull-up node PU, i.e., avoid electricity leakage of the pull-up node PU. When a high-level signal is written into the auxiliary control node PA, the sixteenth transistor M16 is turned on, the pull-down control node PC is pulled down to the first low level, the pull-down subcircuit 104 is open, the pull-down node PD is the first low level, the fifteenth transistor M15 is turned on, the first low-level signal is continuously written into the pull-down node PD, the pull-down subcircuit 104 is continuously open, the first power supply voltage signal is continuously written into the pull-down node PD, and the first noise reduction subcircuit 105 continues to be closed, which continuously denoises the pull-up node PU. It can be seen that in the shift register unit provided by the embodiments of the present disclosure, regardless of whether the first noise reduction subcircuit 105 is open or closed, the potential of the pull-up node PU can reach a preset potential, avoiding the influence of the first noise reduction subcircuit 105 on the potential of the pull-up node PU, thereby ensuring the stability of an output signal of the signal output terminal Output, and thus ensuring a good display effect of the driven display panel.

In some embodiments, as shown in FIGS. 2, 3, and 4, the shift register unit further includes a second noise reduction subcircuit 106, where the second noise reduction subcircuit 106 is configured to denoise the potential of the signal output terminal Output through the second low-level signal in response to the potential of the pull-down node PD.

In some embodiments, the second noise reduction subcircuit 106 includes a fourth transistor M4, where the gate electrode of the fourth transistor M4 is connected to the pull-down node PD, the source electrode of the fourth transistor M4 is connected to the second low-level terminal VGL, and the drain electrode of the fourth transistor M4 is connected to the signal output terminal Output.

In the noise reduction stage, the pull-down node PD is at a high-level potential, and the fourth transistor M4 is turned on. At this point, the signal output terminal Output can be denoised through the second low-level signal.

In some embodiments, as shown in FIGS. 2, 3, and 4, the shift register unit further includes a reset subcircuit 107, where the reset subcircuit 107 is configured to reset the potential of the pull-up node PU through the second low-level signal in response to a reset signal.

In some embodiments, the reset subcircuit 107 includes a second transistor M2, where the gate electrode of the second transistor M2 is connected to the reset signal terminal Reset, the source electrode of the second transistor M2 is connected to the second low-level terminal VGL, and the drain electrode of the second transistor M2 is connected to the pull-up node PU.

At the reset stage, a high-level signal is input at the reset signal terminal Reset, and the second transistor M2 is turned on. At this point, the pull-up node PU can be reset through the second low-level signal.

It should be noted that in the same shift register unit, the second noise reduction subcircuit 106 and the reset subcircuit 107 can be set simultaneously, or only one of the second noise reduction subcircuit 106 and the reset subcircuit 107 can be set. For example, in the circuits shown in FIGS. 2 and 4, the second noise reduction subcircuit 106 and the reset subcircuit 107 are set, and in the circuit shown in FIG. 3, only the second noise reduction subcircuit 106 is set.

In some embodiments, as shown in FIGS. 2, 3, and 4, the input subcircuit 101 includes a first transistor M1, where the gate electrode and the source electrode of the first transistor M1 are connected to the signal input terminal Input, and the drain electrode of the first transistor M1 is connected to the pull-up node PU.

In the input stage, a high-level signal is written into the signal input terminal Input, and the first transistor M1 is turned on, and the pull-up node can be precharged by the high-level signal written into the signal input terminal Input.

In some embodiments, as shown in FIGS. 2, 3, and 4, the output subcircuit 102 includes a third transistor M3 and a second storage capacitor C2, where the gate electrode of the third transistor M3 is connected to the pull-up node PU, the source electrode of the third transistor M3 is connected to the clock signal terminal CLK, and the drain electrode of the third transistor M3 is connected to the signal output terminal Output; and one end of the second storage capacitor C2 is connected to the pull-up node PU, and the other end of the second storage capacitor C2 is connected to the signal output terminal Output.

In the output stage, the potential of the pull-up node PU is high-level, and the third transistor M3 is turned on, to output the clock signal of the clock signal terminal CLK to the output signal terminal Output, the clock signal of the clock signal terminal CLK is high-level, and at this point, the potential of the signal output terminal Output is pulled up, which means outputting a high-level signal.

In some embodiments, as shown in FIGS. 2, 3, and 4, the pull-down control subcircuit 103 includes a fifth transistor M5, where the gate electrode and the source electrode of the fifth transistor M5 are connected to the first power supply voltage terminal VDD, and the drain electrode of the fifth transistor M5 is connected to the pull-down node PD.

The gate electrode and the source electrode of the fifth transistor M5 are connected to the first power supply voltage terminal VDD, that is, the first power supply voltage signals are written into the gate electrode and the source electrode of the fifth transistor M5. At this point, the fifth transistor M5 is turned on, and the potential of the pull-down node PD is the potential of the first power supply voltage, which means the potential of the pull-down node PD is high-level.

In some embodiments, as shown in FIGS. 2 and 4, the pull-down subcircuit includes a sixth transistor M6 and a seventh transistor M7, where the gate electrode of the sixth transistor M6 is connected to the pull-down control node PC, the source of the sixth transistor M6 is connected to the first reference level terminal LVGL, and the drain of the sixth transistor M6 is connected to the pull-down node PD; and the gate electrode of the seventh transistor M7 is connected to the signal input terminal Input, the source electrode of the seventh transistor M7 is connected to the first power supply voltage terminal VDD, and the drain electrode of the seventh transistor M7 is connected to the pull-down node PD.

When a high-level signal is written into the signal input terminal Input, the seventh transistor M7 is turned on, and the first low-level signal is written into the pull-down node PD, and at the same time, a high-level signal is written into the auxiliary control terminal, the sixth transistor M6 is turned on, and the first low-level signal can be continuously written into the pull-down node, which ensures that the potential of the pull-down node PD is continuously pulled down.

In some embodiments, as shown in FIGS. 2, 3, and 4, the first noise reduction subcircuit 105 includes an eighth transistor M8, where the gate electrode of the eighth transistor M8 is connected to the pull-down node PD, the source electrode of the eighth transistor M8 is connected to the second low-level terminal VGL, and the drain electrode of the eighth transistor M8 is connected to the pull-up node PU.

In the noise reduction stage, the pull-down node PD is at a high-level potential, and the eighth transistor M8 is turned on, and at this point, the pull-down node PU can be denoised through the second low-level signal.

Figure 5:
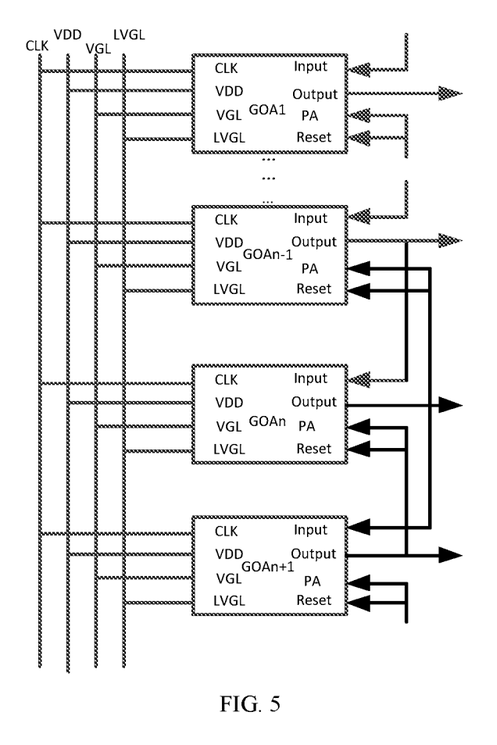
FIG. 5 is a structural schematic diagram of a gate driver circuit according to embodiments of the present disclosure.

The embodiments of the present disclosure further provide a gate driver circuit. FIG. 5 is a structural schematic diagram of a gate driver circuit according to embodiments of the present disclosure. As shown in FIG. 5, the gate driver circuit includes a plurality of the shift register units as provided in any one of the aforementioned embodiments that are cascaded with each other, where a signal input terminal Input of a current shift register unit is connected to a signal output terminal Output of a previous shift register unit immediately adjacent to the current shift register unit, a reset signal terminal Reset of the current shift register unit is connected to a signal output terminal Output of a next shift register unit immediately adjacent to the current shift register unit, and an auxiliary control terminal PA of the current shift register unit is connected to the signal output terminal Output of the next shift register unit immediately adjacent to the current shift register unit.

The gate driver circuit according to embodiments of the present disclosure can output scanning signals one by one to drive the display panel to perform line-by-line scanning to realize the display function. Since the first auxiliary control subcircuit 108 is added to the shift register unit, when the pull-up node PU is a high-level signal, the pull-down node PD is the first low-level signal, and the pull-down control node PC is a high-level signal. At this point, the pull-down subcircuit 104 continues to be closed, causing the potential of the pull-down node PD to be continuously pulled down by the first low-level signal, thereby ensuring that the first noise reduction subcircuit 105 is fully open, and the voltages of the first low-level signal and the second low-level signal can be used to control the first noise reduction subcircuit 105 to be fully open, which can avoid the influence of the first noise reduction subcircuit 105 on the potential of the pull-up node PU, i.e., avoid electricity leakage of the pull-up node PU. At the same time, the second auxiliary control subcircuit 109 is added to the shift register unit. When the pull-up node PU is a low-level signal, the pull-down node PD is the first power supply voltage signal, i.e., the pull-down node PD is a high-level signal, and the pull-down control node PC is the first low-level signal. At this point, the pull-down subcircuit 104 remains open, such that the first power supply voltage signal continues to be written into the pull-down node PD, which ensures that the first noise reduction subcircuit 105 is fully closed, thereby ensuring that the first noise reduction subcircuit 105 continuously denoises the pull-up node PU through the second low-level signal. It can be seen that in the shift register unit provided by the embodiments of the present disclosure, regardless of whether the first noise reduction subcircuit 105 is open or closed, the potential of the pull-up node PU can reach a preset potential, avoiding the influence of the first noise reduction subcircuit 105 on the potential of the pull-up node PU, thereby ensuring the stability of an output signal of the signal output terminal Output, and thus ensuring a good display effect of the driven display panel.

Embodiments of the present disclosure further provides a display device, including the gate driver circuit as provided in any one of the above embodiments. The display device can be a large-sized television, display, vehicle navigator or other display devices, and its implementation principle and technical effect are the same as the implementation principle and technical effect of the gate driver circuit provided in any one of the above embodiments, which will not be further elaborated here.

The embodiments of the present disclosure further provide a driving method for a shift register unit, for driving the shift register unit provided by any one of the above embodiments. The driving method for the shift register unit includes:

when the pull-down node is the first reference level signal, by the first auxiliary control subcircuit, writing the third reference level signal to the pull-down control node, and controlling the pull-down subcircuit to be closed to control the first noise reduction subcircuit to be open; and when the pull-down node is the first power supply voltage signal, by the second auxiliary control subcircuit, writing the first reference level signal to the pull-down control node, and controlling the pull-down subcircuit to be open to control the first noise reduction subcircuit to denoise the pull-up node through the second reference level signal.

The following provides a detailed explanation of the driving method for the shift register unit according to embodiments of the present disclosure, in conjunction with the shift register units shown in FIGS. 2, 3, and 4.

In the shift register unit shown in FIG. 2, when the first storage capacitor C1 and the pull-up node PU are simultaneously charged with a high-level signal, the high-level signal stored by the first storage capacitor C1 can pull up the potential of the pull-down control node PC to control the pull-down subcircuit 104 to remain closed, such that the potential of the pull-down node PD continue to be pulled down by the first low-level signal, ensuring that the first noise reduction subcircuit 105 is fully open, which can avoid the influence of the first noise reduction subcircuit 105 on the potential of the pull-up node PU, i.e., avoid electricity leakage of the pull-up node PU. When a high-level signal is written into the auxiliary control node PA, the ninth transistor M9 is turned on, the pull-up node PU is discharged to the second low-level potential, and the first storage capacitor C1 is discharged to the first low-level potential, such that the pull-down control node PC is the first low-level potential, the pull-down subcircuit 104 is open, and the first power supply voltage signal is written into the pull-down node PD, i.e., the pull-down node PD is high-level, and the tenth transistor M10 continues to be turned on, the pull-down subcircuit 104 continues to be open, the first power supply voltage signal continues to be written into the pull-down node PD, and the first noise reduction subcircuit 105 continues to be closed, which can continuously denoise the pull-up node PU.

In the shift register unit shown in FIG. 3, when both the pull-down control node PC and the pull-up node PU are simultaneously charged with high-level signals, the pull-down subcircuit 104 remains closed, such that the potential of the pull-down node PD continue to be pulled down by the first low-level signal, ensuring that the first noise reduction subcircuit 105 is fully open, which can avoid the influence of the first noise reduction subcircuit 105 on the potential of the pull-up node PU, i.e., avoid electricity leakage of the pull-up node PU. When a high-level signal is written into the auxiliary control node PA, the twelfth transistor M12 is turned on, the pull-down control node PC is pulled down to the first low level, the pull-down subcircuit 104 is open, the pull-down node PD is the first low level, the thirteenth transistor M13 is turned on, the first low-level signal is continuously written into the pull-down node PD, the pull-down subcircuit 104 is continuously open, the first power supply voltage signal is continuously written into the pull-down node PD, and the first noise reduction subcircuit 105 continues to be closed, which continuously denoises the pull-up node PU.

In the shift register unit shown in FIG. 4, when the first power supply voltage signals are simultaneously written into the pull-down control node PC and the pull-down node PD, the pull-down subcircuit 104 remains closed, such that the potential of the pull-down node PD continue to be pulled down by the first low-level signal, ensuring that the first noise reduction subcircuit 105 is fully open, which can avoid the influence of the first noise reduction subcircuit 105 on the potential of the pull-up node PU, i.e., avoid electricity leakage of the pull-up node PU. When a high-level signal is written into the auxiliary control node PA, the sixteenth transistor M16 is turned on, the pull-down control node PC is pulled down to the first low level, the pull-down subcircuit 104 is open, the pull-down node PD is the first low level, the fifteenth transistor M15 is turned on, the first low-level signal is continuously written into the pull-down node PD, the pull-down subcircuit 104 is continuously open, the first power supply voltage signal is continuously written into the pull-down node PD, and the first noise reduction subcircuit 105 continues to be closed, which continuously denoises the pull-up node PU.

It can be seen that in the driving method for the shift register unit provided by the embodiments of the present disclosure, regardless of whether the first noise reduction subcircuit 105 is open or closed, the potential of the pull-up node PU can reach a preset potential, avoiding the influence of the first noise reduction subcircuit 105 on the potential of the pull-up node PU, thereby ensuring the stability of an output signal of the signal output terminal Output, and thus ensuring a good display effect of the driven display panel.

It can be understood that the above embodiments are only exemplary embodiments adopted to illustrate the principles of the present disclosure, however, the present disclosure is not limited to these embodiments. For the skilled in the art, various variations and improvements can be made without departing from the spirit and essence of the present disclosure, and these variations and improvements are also considered in the scope of protection of the present disclosure.

The invention claimed is:

1. A shift register unit, comprising an input subcircuit, an output subcircuit, a pull-down control subcircuit, a pull-down subcircuit, a first noise reduction subcircuit, a first auxiliary control subcircuit, and a second auxiliary control subcircuit; wherein
   the input subcircuit is configured to, in response to an input signal from a signal input terminal, raise a potential of a pull-up node through the input signal, wherein the pull-up node is simultaneously connected to at least the input subcircuit, the output subcircuit, and the first noise reduction subcircuit;
   the output subcircuit is configured to, in response to a pulled-up potential of the pull-up node, output a signal through a signal output terminal;
   the pull-down control subcircuit is configured to, in response to a first power supply voltage signal, control a potential of a pull-down node through the first power supply voltage signal, wherein the pull-down node is simultaneously connected to at least the pull-down control subcircuit, the pull-down subcircuit, and the first noise reduction subcircuit;
   the pull-down subcircuit is configured to, in response to a potential of a pull-down control node, pull down the potential of the pull-down node through a first reference level signal, wherein the pull-down control node is simultaneously connected to at least the pull-down subcircuit, the first auxiliary control subcircuit, and the second auxiliary control subcircuit;
   the first noise reduction subcircuit is configured to, in response to the potential of the pull-down node, denoise a potential of the pull-up node through a second reference level signal;
   the first auxiliary control subcircuit is configured to, when the pull-down node is the first reference level signal, write a third reference level signal to the pull-down control node, and control the pull-down subcircuit to be closed to control the first noise reduction subcircuit to be open; and
   the second auxiliary control subcircuit is configured to, when the pull-down node is the first power voltage signal, write the first reference level signal to the pull-down control node, and control the pull-down subcircuit to be open to control the first noise reduction subcircuit to denoise the pull-up node through the second reference level signal.

2. The shift register unit according to claim 1, wherein the first auxiliary control subcircuit comprises a first storage capacitor, wherein one end of the first storage capacitor is connected to the pull-down control node, and the other end of the first storage capacitor is connected to a first power supply voltage terminal, wherein the pull-down control node is connected to the input subcircuit; and
   the second auxiliary control subcircuit comprises a ninth transistor and a tenth transistor, wherein a control electrode of the ninth transistor is connected to an auxiliary control terminal, a first electrode of the ninth transistor is connected to a first reference level terminal, and a second electrode of the ninth transistor is connected to the pull-down control node, and a control electrode of the tenth transistor is connected to the pull-down node, a first electrode of the tenth transistor is connected to the first reference level terminal, and a second electrode of the tenth transistor is connected to the pull-down control node.

3. The shift register unit according to claim 1, wherein the first auxiliary control subcircuit comprises an eleventh transistor, wherein a control electrode and a first electrode of the eleventh transistor are connected to the signal input terminal, and a second electrode of the eleventh transistor is connected to the pull-down control node; and
   the second auxiliary control subcircuit comprises a twelfth transistor and a thirteenth transistor, wherein a control electrode of the twelfth transistor is connected to an auxiliary control terminal, a first electrode of the twelfth transistor is connected to a first reference level terminal, and the second electrode of the twelfth transistor is connected to the pull-down control node, and a control electrode of the thirteenth transistor is connected to the pull-down node, a first electrode of the thirteenth transistor is connected to the first reference level terminal, and a second electrode of the thirteenth transistor is connected to the pull-down control node.

4. The shift register unit according to claim 1, wherein the first auxiliary control subcircuit comprises a fourteenth transistor, wherein a control electrode and a first electrode of the fourteenth transistor are connected to a first power supply voltage terminal, and a second electrode of the fourteenth transistor is connected to the pull-down control node; and
   the second auxiliary control subcircuit comprises a fifteenth transistor and a sixteenth transistor, wherein a control electrode of the fifteenth transistor is connected to the pull-down node, a first electrode of the fifteenth transistor is connected to a first reference level terminal, and a second electrode of the fifteenth transistor is connected to the pull-down control node, and a control electrode of the sixteenth transistor is connected to an auxiliary control terminal, a first electrode of the sixteenth transistor is connected to the first reference level terminal, and a second electrode of the sixteenth transistor is connected to the pull-down control node.

5. The shift register unit according to claim 1, wherein the shift register unit further comprises a second noise reduction subcircuit, wherein the second noise reduction subcircuit is configured to, in response to the potential of the pull-down node, denoise a potential of the signal output terminal through the second reference level signal.

6. The shift register unit according to claim 5, wherein the second noise reduction subcircuit comprises a fourth transistor, wherein a control electrode of the fourth transistor is connected to the pull-down node, a first electrode of the fourth transistor is connected to a second reference level terminal, and a second electrode of the fourth transistor is connected to the signal output terminal.

7. The shift register unit according to claim 1, wherein the shift register unit further comprises a reset subcircuit, wherein the reset subcircuit is configured to, in response to a reset signal, reset a potential of the pull-up node through the second reference level signal.

8. The shift register unit according to claim 7, wherein the reset subcircuit comprises a second transistor, wherein a control electrode of the second transistor is connected to a reset signal terminal, a first electrode of the second transistor is connected to a second reference level terminal, and a second electrode of the second transistor is connected to the pull-up node.

9. The shift register unit according to claim 1, wherein the input subcircuit comprises a first transistor, wherein a control electrode and a first electrode of the first transistor are connected to the signal input terminal, and the second electrode of the first transistor is connected to the pull-up node.

10. The shift register unit according to claim 1, wherein the output subcircuit comprises a third transistor and a second storage capacitor, wherein
a control electrode of the third transistor is connected to the pull-up node, a first electrode of the third transistor is connected to a clock signal terminal, and a second electrode of the third transistor is connected to the signal output terminal; and
one end of the second storage capacitor is connected to the pull-up node, and the other end of the second storage capacitor is connected to the signal output terminal.

11. The shift register unit according to claim 1, wherein the pull-down control subcircuit comprises a fifth transistor, wherein a control electrode and a first electrode of the fifth transistor are connected to a first power supply voltage terminal, and a second electrode of the fifth transistor is connected to the pull-down node.

12. The shift register unit according to claim 1, wherein the pull-down subcircuit comprises a sixth transistor and a seventh transistor, wherein
a control electrode of the sixth transistor is connected to the pull-down control node, a first electrode of the sixth transistor is connected to a first reference level terminal, and a second electrode of the sixth transistor is connected to the pull-down node; and
a control electrode of the seventh transistor is connected to the signal input terminal, a first electrode of the seventh transistor is connected to a first power supply voltage terminal, and a second electrode of the seventh transistor is connected to the pull-down node.

13. The shift register unit according to claim 12, wherein the first noise reduction subcircuit comprises an eighth transistor, wherein a control electrode of the eighth transistor is connected to the pull-down node, a first electrode of the eighth transistor is connected to the first reference level terminal, and a second electrode of the eighth transistor is connected to the pull-up node.

14. A shift register unit, comprising an input subcircuit, a reset subcircuit, an output subcircuit, a pull-down control subcircuit, a pull-down subcircuit, a first noise reduction subcircuit, a second noise reduction subcircuit, a first auxiliary control subcircuit, and a second auxiliary control subcircuit, wherein a pull-up node is simultaneously connected to the input subcircuit, the output subcircuit, and the first noise reduction subcircuit, a pull-down node is simultaneously connected to the pull-down control subcircuit, the pull-down subcircuit, and the first noise reduction subcircuit, and a pull-down control node is simultaneously connected to the pull-down subcircuit, the first auxiliary control subcircuit, and the second auxiliary control subcircuit; wherein
the input subcircuit comprises a first transistor, the reset subcircuit comprises a second transistor, the output subcircuit comprises a third transistor and a second storage capacitor, the second noise reduction subcircuit comprises a fourth transistor, the pull-down control subcircuit comprises a fifth transistor, the pull-down subcircuit comprises a sixth transistor and a seventh transistor, the first noise reduction subcircuit comprises an eighth transistor, the first auxiliary control subcircuit comprises a first storage capacitor, and the second auxiliary control subcircuit comprises a ninth transistor and a tenth transistor; wherein
a control electrode and a first electrode of the first transistor are connected to a signal input terminal, and a second electrode of the first transistor is connected to the pull-up node;
a control electrode of the second transistor is connected to a reset signal terminal, a first electrode of the second transistor is connected to a second reference level terminal, and a second electrode of the second transistor is connected to the pull-up node;
a control electrode of the third transistor is connected to the pull-up node, a first electrode of the third transistor is connected to a clock signal terminal, and a second electrode of the third transistor is connected to a signal output terminal;
one end of the second storage capacitor is connected to the pull-up node, and the other end of the second storage capacitor is connected to the signal output terminal;
a control electrode of the fourth transistor is connected to the pull-down node, a first electrode of the fourth transistor is connected to the second reference level terminal, and a second electrode of the fourth transistor is connected to the signal output terminal;
a control electrode and a first electrode of the fifth transistor are connected to a first power supply voltage terminal, and a second electrode of the fifth transistor is connected to the pull-down node;
a control electrode of the sixth transistor is connected to the pull-down control node, a first electrode of the sixth transistor is connected to the first reference level terminal, and a second electrode of the sixth transistor is connected to the pull-down node;
a control electrode of the seventh transistor is connected to the signal input terminal, a first electrode of the seventh transistor is connected to the first power supply voltage terminal, and a second electrode of the seventh transistor is connected to the pull-down node;
a control electrode of the eighth transistor is connected to the pull-down node, a first electrode of the eighth transistor is connected to the first reference level terminal, and a second electrode of the eighth transistor is connected to the pull-up node; and
one end of the first storage capacitor is connected to the pull-down control node, and the other end of the first storage capacitor is connected to the first power supply voltage terminal, and the pull-down control node is connected to the second electrode of the first transistor; and
a control electrode of the ninth transistor is connected to an auxiliary control terminal, a first electrode of the ninth transistor is connected to the first reference level terminal, and a second electrode of the ninth transistor is connected to the pull-down control node, and a control electrode of the tenth transistor is connected to the pull-down node, a first electrode of the tenth transistor is connected to the first reference level terminal, and a second electrode of the tenth transistor is connected to the pull-down control node.

15. A shift register unit, wherein the shift register unit comprises an input subcircuit, a reset subcircuit, an output subcircuit, a pull-down control subcircuit, a pull-down subcircuit, a first noise reduction subcircuit, a second noise reduction subcircuit, a first auxiliary control subcircuit, and a second auxiliary control subcircuit, wherein a pull-up node is simultaneously connected to the input subcircuit, the output subcircuit, and the first noise reduction subcircuit, a pull-down node is simultaneously connected to the pull-down control subcircuit, the pull-down subcircuit, and the first noise reduction subcircuit, and a pull-down control node is simultaneously connected to the pull-down subcircuit, the first auxiliary control subcircuit, and the second auxiliary control subcircuit; wherein the input subcircuit comprises a first transistor, the reset subcircuit comprises a second transistor, the output subcircuit comprises a third transistor and a second storage capacitor, the second noise reduction subcircuit comprises a fourth transistor, the pull-down control subcircuit comprises a fifth transistor, the pull-down subcircuit comprises a sixth transistor and a seventh transistor, the first noise reduction subcircuit comprises an eighth transistor; wherein a control electrode and a first electrode of the first transistor are connected to a signal input terminal, and a second electrode of the first transistor is connected to the pull-up node;

a control electrode of the second transistor is connected to a reset signal terminal, a first electrode of the second transistor is connected to a second reference level terminal, and a second electrode of the second transistor is connected to the pull-up node;

a control electrode of the third transistor is connected to the pull-up node, a first electrode of the third transistor is connected to a clock signal terminal, and a second electrode of the third transistor is connected to a signal output terminal;

one end of the second storage capacitor is connected to the pull-up node, and the other end of the second storage capacitor is connected to the signal output terminal;

a control electrode of the fourth transistor is connected to the pull-down node, a first electrode of the fourth transistor is connected to the second reference level terminal, and a second electrode of the fourth transistor is connected to the signal output terminal;

a control electrode and a first electrode of the fifth transistor are connected to a first power supply voltage terminal, and a second electrode of the fifth transistor is connected to the pull-down node;

a control electrode of the sixth transistor is connected to the pull-down control node, a first electrode of the sixth transistor is connected to the first reference level terminal, and a second electrode of the sixth transistor is connected to the pull-down node;

a control electrode of the seventh transistor is connected to the signal input terminal, a first electrode of the seventh transistor is connected to the first power supply voltage terminal, and a second electrode of the seventh transistor is connected to the pull-down node;

a control electrode of the eighth transistor is connected to the pull-down node, a first electrode of the eighth transistor is connected to the first reference level terminal, and a second electrode of the eighth transistor is connected to the pull-up node.

16. The shift register unit according to claim 15, wherein the first auxiliary control subcircuit comprises an eleventh transistor, and the second auxiliary control subcircuit comprises a twelfth transistor and a thirteenth transistor, wherein a control electrode and a first electrode of the eleventh transistor are connected to the signal input terminal, and a second electrode of the eleventh transistor is connected to the pull-down control node; and a control electrode of the twelfth transistor is connected to an auxiliary control terminal, a first electrode of the twelfth transistor is connected to the first reference level terminal, and a second electrode of the twelfth transistor is connected to the pull-down control node, and a control electrode of the thirteenth transistor is connected to the pull-down node, a first electrode of the thirteenth transistor is connected to the first reference level terminal, and a second electrode of the thirteenth transistor is connected to the pull-down control node; or the first auxiliary control subcircuit comprises a fourteenth transistor, and the second auxiliary control subcircuit comprises a fifteenth transistor and a sixteenth transistor; wherein a control electrode and a first electrode of the fourteenth transistor are connected to the first power supply voltage terminal, and a second electrode of the fourteenth transistor is connected to the pull-down control node; and a control electrode of the fifteenth transistor is connected to the pull-down node, a first electrode of the fifteenth transistor is connected to the first reference level terminal, and a second electrode of the fifteenth transistor is connected to the pull-down control node, and a control electrode of the sixteenth transistor is connected to an auxiliary control terminal, a first electrode of the sixteenth transistor is connected to the first reference level terminal, and a second electrode of the sixteenth transistor is connected to the pull-down control node.

17. A gate driver circuit, comprising a plurality of the shift register units according to claim 1 that are mutually cascaded.

18. The gate driver circuit according to claim 17, wherein a signal input terminal of a current shift register unit is connected to a signal output terminal of a previous shift register unit immediately adjacent to the current shift register unit;

a reset signal terminal of the current shift register unit is connected to a signal output terminal of a next shift register unit immediately adjacent to the current shift register unit; and an auxiliary control terminal of the current shift register unit is connected to the signal output terminal of the next shift register unit immediately adjacent to the current shift register unit.

19. A display device, comprising the gate driver circuit according to claim 17.

20. A driving method for a shift register unit, for driving the shift register unit according to claim 1, wherein the driving method for the shift register unit comprises:

when the pull-down node is the first reference level signal, by the first auxiliary control subcircuit, writing the third reference level signal to the pull-down control node, and controlling the pull-down subcircuit to be closed to control the first noise reduction subcircuit to be open; and when the pull-down node is the first power voltage signal, by a second auxiliary control subcircuit, writing the first reference level signal to the pull-down control node, and controlling the pull-down subcircuit to be open to control the first noise reduction subcircuit to denoise the pull-up node through the second reference level signal.

\* \* \* \* \*